US007835182B2

(12) United States Patent
Hosono

(10) Patent No.: US 7,835,182 B2
(45) Date of Patent: Nov. 16, 2010

(54) NON-VOLATILE SEMICONDUCTOR MEMORY DEVICE AND METHOD OF WRITING DATA IN NON-VOLATILE SEMICONDUCTOR MEMORY DEVICES

(75) Inventor: Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/493,744

(22) Filed: Jun. 29, 2009

(65) Prior Publication Data

US 2009/0262579 A1 Oct. 22, 2009

Related U.S. Application Data

(63) Continuation of application No. 11/857,091, filed on Sep. 18, 2007, now Pat. No. 7,561,468.

(30) Foreign Application Priority Data

Sep. 19, 2006 (JP) ............................ 2006-252627

(51) Int. Cl.
*G11C 11/34* (2006.01)
*G11C 16/04* (2006.01)

(52) U.S. Cl. ............................ 365/185.17; 365/185.03

(58) Field of Classification Search ............ 365/185.17, 365/185.03, 185.2
See application file for complete search history.

(56) References Cited

U.S. PATENT DOCUMENTS 6,987,694 B2 1/2006 Lee
7,212,447 B2 5/2007 Aritome
7,269,068 B2 9/2007 Chae et al.
7,272,049 B2 * 9/2007 Kang et al. .............. 365/185.2
7,646,657 B2 * 1/2010 Imai ...................... 365/210.13
7,755,944 B2 * 7/2010 Hwang et al. .......... 365/185.11
2008/0181009 A1 7/2008 Aria et al.

FOREIGN PATENT DOCUMENTS

KR 100170296 B1 3/1999

OTHER PUBLICATIONS

Jae-Duk Lee, et al., "A new Programming Disturbance Phenomenon in NAND Flash Memory by Source/Drain Hot-Electrons Generated by GIDL Current", IEEE, NVSMW 2006, 21st Non-Volatile Semiconductor Memory Workshop, Feb. 12-16, 2006, 5 Pages.

(Continued)

*Primary Examiner*—Anh Phung
(74) *Attorney, Agent, or Firm*—Oblon, Spivak, McClelland, Maier & Neustadt, L.L.P.

(57) ABSTRACT

The device has a data write mode to boost a first boost channel region that contains a non-write selected memory cell and non-selected memory cells located closer to the first selection gate transistor, and a second boost channel region that contains non-selected memory cells located closer to the second selection gate transistor than the selected memory cell, both electrically separated from each other. In this mode, a write non-selection voltage applied to a non-selected memory cell next to the second selection gate transistor is switched, at least in two stages, between a lower voltage V1 than a write non-selection voltage Vm applied to other non-selected memory cells in the NAND cell unit and a higher voltage V2 than the lower voltage (V1<V2≦Vm).

6 Claims, 17 Drawing Sheets

| | WL0 Selected | WL1 Selected | WL2 Selected | WL3 Selected | WL4 Selected | WL5 Selected | WL6 Selected | WL7 Selected |
|---|---|---|---|---|---|---|---|---|
| WLDD | V3 | V3 | V3 | V3 | V3 | V3 | V3 | V3 |
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | 0V |
| WL4 | Vm | Vm | Vm | Vm | Vpgm | Va | 0V | Vm |
| WL3 | Vm | Vm | Vm | Vpgm | Va | 0V | Vm | Vm |
| WL2 | Vm | Vm | Vpgm | Va | 0V | Vm | Vm | Vm |
| WL1 | Vm | Vpgm | Va | 0V | Vm | Vm | Vm | Vm |
| WL0 | Vpgm | Va | 0V | Vm | Vm | Vm | Vm | Vm |
| WLDS | V2 | V2 | V2 | V2 | V1 | V1 | V1 | V1 |

OTHER PUBLICATIONS

Ki-Tae Park, et al., "Scalable Wordline Shielding Scheme using Dummy Cell beyond 40nm NAND Flash Memory for Eliminating Abnormal Disturb of Edge Memory Cell", Extended Abstracts of the 2006 International Conference on Solid State Devices and Materials, C-6-4L, 2006, pp. 298-299.

* cited by examiner

VRDEC
TG
SGD
Selected WLn
Non-selected WL
(Except n-1, n-2)
Non-selected WLn-1
Non-selected WLn-2
BL
Vpgm+Vt
Selected Block Vpgm+Vt
Non-selected Block 0V
Vdd
Vpgm
Vm
Va
0V
Vdd ("1"prog)
0V ("0"prog)
T1
T2
T3
T4 T5 T6

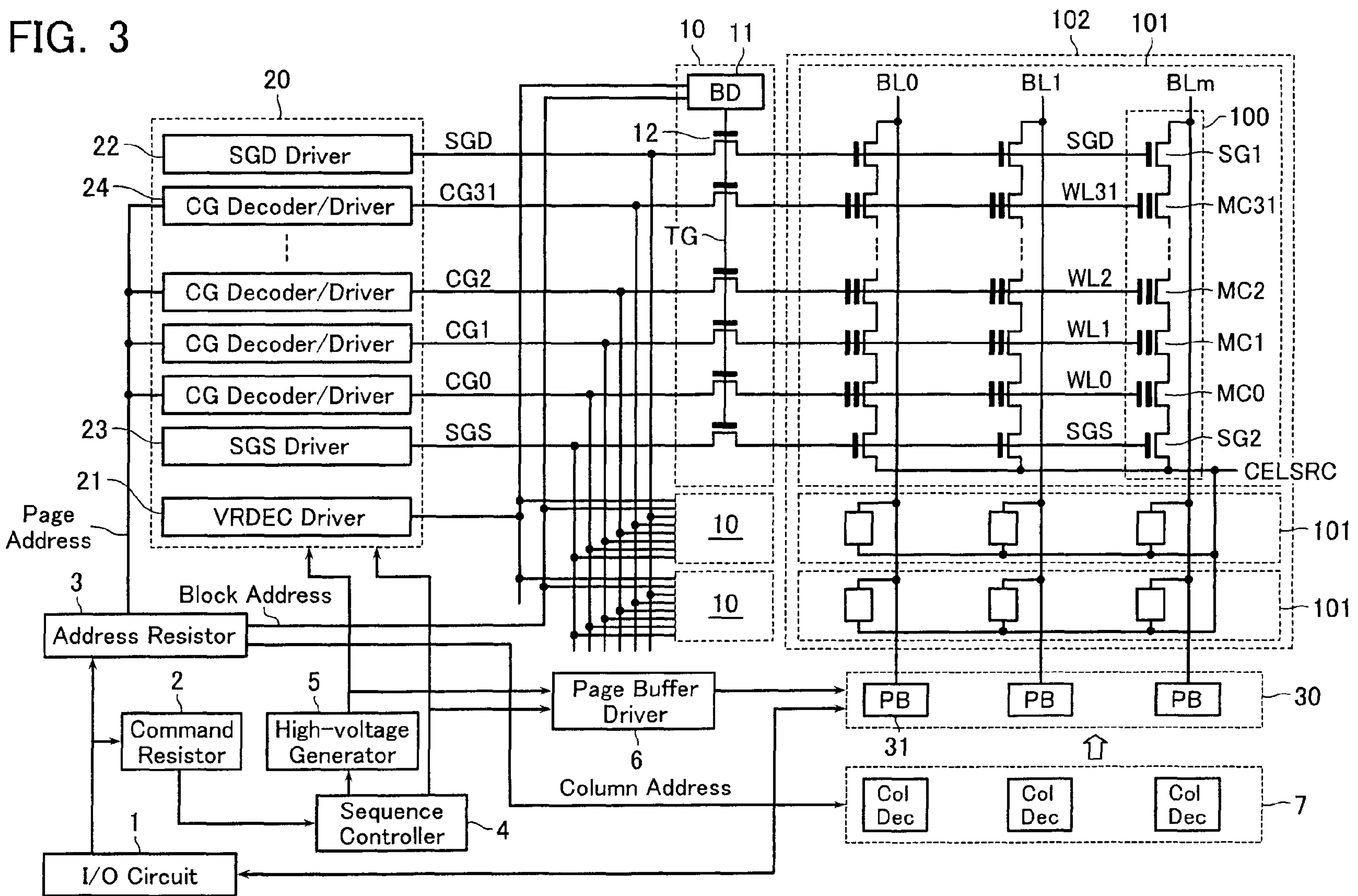
FIG. 3
20
22
SGD Driver
24
CG Decoder/Driver
CG Decoder/Driver
CG Decoder/Driver
CG Decoder/Driver
23
SGS Driver
21
VRDEC Driver
Page Address
SGD
CG31
CG2
CG1
CG0
SGS
10
11
BD
12
TG
102
101
BL0
BL1
BLm
100
SGD
WL31
WL2
WL1
WL0
SGS
SG1
MC31
MC2
MC1
MC0
SG2
CELSRC
10
10
101
101
3
Address Resistor
Block Address
2
Command Resistor
5
High-voltage Generator
Page Buffer Driver
6
Column Address
PB
PB
PB
31
30
Col Dec
Col Dec
Col Dec
7
Sequence Controller
4
1
I/O Circuit CELSRC
BL
Vdd
Selected cell
(SGS)
SG2
0V
(WL0)
MC0
V1
(WL1)
MC1
0V
(WL2)
MC2
Va
(WL3)
MC3
Vpgm
(WL4)
MC4
Vm
(WL5)
MC5
Vm
(WL6)
MC6
Vm
(WL7)
MC7
Vm
(SGD)
SG1
Vsgd
A
B
Cell Pwell
Cell Nwell
Psub CELSRC
(SGS)
SG2
0V
(WL0)
MC0
V2
(WL1)
MC1
Vm
(WL2)
MC2
0V
(WL3)
MC3
Va
Selected cell
(WL4)
MC4
Vpgm
(WL5)
MC5
Vm
(WL6)
MC6
Vm
(WL7)
MC7
Vm
(SGD)
SG1
Vsgd
BL
Vdd
A
B
Cell Pwell
Cell Nwell
Psub

| | WL0 Selected | WL1 Selected | WL2 Selected | WL3 Selected | WL4 Selected | WL5 Selected | WL6 Selected | WL7 Selected |
|---|---|---|---|---|---|---|---|---|
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | 0V |
| WL4 | Vm | Vm | Vm | Vm | Vpgm | Va | 0V | Vm |
| WL3 | Vm | Vm | Vm | Vpgm | Va | 0V | Vm | Vm |
| WL2 | Vm | Vm | Vpgm | Va | 0V | Vm | Vm | Vm |
| WL1 | Vm | Vpgm | Va | 0V | Vm | Vm | Vm | Vm |
| WL0 | Vpgm | Va | V2 | V2 | V2 | V1 | V1 | V1 |

FIG. 15

| | WL0 Selected | WL1 Selected | WL2 Selected | WL3 Selected | WL4 Selected | WL5 Selected | WL6 Selected | WL7 Selected |
|---|---|---|---|---|---|---|---|---|
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | 0V |
| WL4 | Vm | Vm | Vm | Vm | Vpgm | Va | 0V | Vm |
| WL3 | Vm | Vm | Vm | Vpgm | Va | 0V | Vm | Vm |
| WL2 | Vm | Vm | Vpgm | Va | 0V | Vm | Vm | Vm |
| WL1 | Vm | Vpgm | Va | 0V | Vm | Vm | Vm | Vm |
| WL0 | Vpgm | Va | 0V | Vm | Vm | Vm | Vm | Vm |

FIG. 16

| | WL0 Selected | WL1 Selected | WL2 Selected | WL3 Selected | WL4 Selected | WL5 Selected | WL6 Selected | WL7 Selected |
|---|---|---|---|---|---|---|---|---|
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | 0V |
| WL4 | Vm | Vm | Vm | Vm | Vpgm | Va | 0V | Vm |
| WL3 | Vm | Vm | Vm | Vpgm | Va | 0V | Vm | Vm |
| WL2 | Vm | Vm | Vpgm | Va | 0V | Vm | Vm | Vm |
| WL1 | Vm | Vpgm | Va | 0V | Vm | Vm | Vm | Vm |
| WL0 | Vpgm | V2 | V2 | V2 | V2 | V1 | V1 | V1 |

| | WL0 Selected | WL1 Selected | WL2 Selected | WL3 Selected | WL4 Selected | WL5 Selected | WL6 Selected | WL7 Selected |
|---|---|---|---|---|---|---|---|---|
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | 0V |
| WL4 | Vm | Vm | Vm | Vm | Vpgm | Va | 0V | Vm |
| WL3 | Vm | Vm | Vm | Vpgm | Va | 0V | Vm | Vm |
| WL2 | Vm | Vm | Vpgm | Va | 0V | Vm | Vm | Vm |
| WL1 | Vm | Vpgm | Va | 0V | Vm | Vm | Vm | Vm |
| WL0 | Vpgm | Va | 0V | Vm | Vm | Vm | Vm | Vm |
| WLD | Va | V2 | V2 | V2 | V1 | V1 | V1 | V1 |

FIG. 20

| | WL0 Selected | WL1 Selected | WL2 Selected | WL3 Selected | WL4 Selected | WL5 Selected | WL6 Selected | WL7 Selected |
|---|---|---|---|---|---|---|---|---|
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | 0V |
| WL4 | Vm | Vm | Vm | Vm | Vpgm | Va | 0V | Vm |
| WL3 | Vm | Vm | Vm | Vpgm | Va | 0V | Vm | Vm |
| WL2 | Vm | Vm | Vpgm | Va | 0V | Vm | Vm | Vm |
| WL1 | Vm | Vpgm | Va | 0V | Vm | Vm | Vm | Vm |
| WL0 | Vpgm | Va | 0V | Vm | Vm | Vm | Vm | Vm |
| WLD | V2 | V2 | V2 | V2 | V1 | V1 | V1 | V1 |

FIG. 21

| | WL0 Selected | WL1 Selected | WL2 Selected | WL3 Selected | WL4 Selected | WL5 Selected | WL6 Selected | WL7 Selected |
|---|---|---|---|---|---|---|---|---|
| WL7 | V3 | V3 | V3 | V3 | V3 | V3 | Vm | Vpgm |
| WL6 | Vm | Vm | Vm | Vm | Vm | Vm | Vpgm | Va |
| WL5 | Vm | Vm | Vm | Vm | Vm | Vpgm | Va | 0V |
| WL4 | Vm | Vm | Vm | Vm | Vpgm | Va | 0V | Vm |
| WL3 | Vm | Vm | Vm | Vpgm | Va | 0V | Vm | Vm |
| WL2 | Vm | Vm | Vpgm | Va | 0V | Vm | Vm | Vm |
| WL1 | Vm | Vpgm | Va | 0V | Vm | Vm | Vm | Vm |
| WL0 | Vpgm | Va | 0V | Vm | Vm | Vm | Vm | Vm |
| WLDS | Va | V2 | V2 | V2 | V1 | V1 | V1 | V1 |

FIG. 22

| | WL0 Selected | WL1 Selected | WL2 Selected | WL3 Selected | WL4 Selected | WL5 Selected | WL6 Selected | WL7 Selected |
|---|---|---|---|---|---|---|---|---|
| WLDD | V3 | V3 | V3 | V3 | V3 | V3 | V3 | Vm |
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | 0V |
| WL4 | Vm | Vm | Vm | Vm | Vpgm | Va | 0V | Vm |
| WL3 | Vm | Vm | Vm | Vpgm | Va | 0V | Vm | Vm |
| WL2 | Vm | Vm | Vpgm | Va | 0V | Vm | Vm | Vm |
| WL1 | Vm | Vpgm | Va | 0V | Vm | Vm | Vm | Vm |
| WL0 | Vpgm | Va | 0V | Vm | Vm | Vm | Vm | Vm |
| WLDS | Va | V2 | V2 | V2 | V1 | V1 | V1 | V1 |

FIG. 23

| | WL0 Selected | WL1 Selected | WL2 Selected | WL3 Selected | WL4 Selected | WL5 Selected | WL6 Selected | WL7 Selected |
|---|---|---|---|---|---|---|---|---|
| WLDD | V3 | V3 | V3 | V3 | V3 | V3 | V3 | V3 |
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | 0V |
| WL4 | Vm | Vm | Vm | Vm | Vpgm | Va | 0V | Vm |
| WL3 | Vm | Vm | Vm | Vpgm | Va | 0V | Vm | Vm |
| WL2 | Vm | Vm | Vpgm | Va | 0V | Vm | Vm | Vm |
| WL1 | Vm | Vpgm | Va | 0V | Vm | Vm | Vm | Vm |
| WL0 | Vpgm | Va | 0V | Vm | Vm | Vm | Vm | Vm |
| WLDS | V2 | V2 | V2 | V2 | V1 | V1 | V1 | V1 |

FIG. 24

| | WL0 Selected | WL1 Selected | WL2 Selected | WL3 Selected | WL4 Selected | WL5 Selected | WL6 Selected | WL7 Selected |
|---|---|---|---|---|---|---|---|---|
| WLDD | V3 | V3 | V3 | V3 | V3 | V3 | V4 | V4 |
| WL7 | Vm | Vm | Vm | Vm | Vm | Vm | Vm | Vpgm |
| WL6 | Vm | Vm | Vm | Vm | Vm | Vm | Vpgm | Va |
| WL5 | Vm | Vm | Vm | Vm | Vm | Vpgm | Va | 0V |
| WL4 | Vm | Vm | Vm | Vm | Vpgm | Va | 0V | Vm |
| WL3 | Vm | Vm | Vm | Vpgm | Va | 0V | Vm | Vm |
| WL2 | Vm | Vm | Vpgm | Va | 0V | Vm | Vm | Vm |
| WL1 | Vm | Vpgm | Va | 0V | Vm | Vm | Vm | Vm |
| WL0 | Vpgm | Va | 0V | Vm | Vm | Vm | Vm | Vm |
| WLDS | V2 | V2 | V2 | V2 | V1 | V1 | V1 | V1 |

NON-VOLATILE SEMICONDUCTOR MEMORY DEVICE AND METHOD OF WRITING DATA IN NON-VOLATILE SEMICONDUCTOR MEMORY DEVICES

CROSS-REFERENCE TO RELATED APPLICATION

This application is a continuation application of U.S. application Ser. No. 11/857,091 filed Sep. 18, 2007, now U.S. Pat. No. 7,561,468, issued on Jul. 14, 2009, which is based upon and claims the benefit of priority from the prior Japanese Patent Application No. 2006-252627, filed on Sep. 19, 2006. The entire contents of both of those applications are incorporated herein by reference.

BACKGROUND OF THE INVENTION

1. Field of the Invention

The present invention relates to an electrically rewritable (programmable), non-volatile semiconductor memory device, and more particularly to a method of writing (programming) data in NAND-type flash memories.

2. Description of the Related Art

A NAND-type flash memory comprises a plurality of memory cells serially connected to configure a NAND cell unit such that adjacent cells share a source/drain diffused layer. Therefore, it has a smaller unit cell area and can be provided with mass storage easier than a NOR-type. In addition, it utilizes FN tunneling current for write, which reduces current consumption. Therefore, it is possible to increase the number of memory cells for simultaneous write to achieve substantially high-speed write as an advantage.

In the NAND-type flash memory, a self-boosting scheme is used to boost a NAND cell channel efficiently on writing logical data "1" without varying the threshold. With this scheme, the "1"-write cell (write-inhibited cell) and non-selected cells simultaneously supplied with the write voltage are controlled to cause no electron injection therein. For example, a channel separation voltage 0V is applied to a word line associated with non-selected memory cells located closer to a source line than a selected memory cell supplied with a write voltage Vpgm. In addition, a write non-selection voltage (middle voltage) Vm (Vm<Vpgm) is applied to the remaining non-selected memory cells. As a result, at the time of "1"-data write (that is, non-write), channels in the selected cell and non-selected cells located closer to a bit line than the selected cell, and channels in non-selected cells located closer to the source line than the selected cell are separately boosted.

If the channel separation voltage 0V is applied to a non-selected memory cell right next to the selected cell supplied with the write voltage Vpgm, a band-to-band tunneling current causes a leakage through the drain end of the non-selected cell supplied with 0V, which may cause failed write possibly. Therefore, a non-selected cell supplied with Va (0V<Va<Vm) may be sandwiched between the selected cell supplied with Vpgm and the non-selected cell supplied with the channel separation voltage 0V.

The self-boosting write scheme proposed in the art, however, still leaves the risk of write disturbance (failed write) in non-selected cells. For example, the selection gate transistor on the source line side is turned off with the gate voltage set at 0V for write. In this case, GIDL (Gate Induced Drain Leakage) current flows in the edge of this selection gate transistor, thereby causing failed write in adjacent non-selected cells possibly (see, Lae-Duk Lee et al., "A NEW PROGRAMMING DISTURBANCE IN NAND FLASH MEMORY BY SOURCE/DRAIN HOT-ELECTRONS GENERATED BY GIDL CURRENT", NVSMW2006, pp. 31-33). The smaller the interval between the selection gate transistor and the memory cell, and the higher the middle voltage Vm applied to non-selected memory cells, the easier this phenomenon arises.

SUMMARY OF THE INVENTION

In a first aspect the present invention provides a non-volatile semiconductor memory device, comprising a NAND cell unit including a plurality of electrically rewritable non-volatile memory cells serially connected, the NAND cell unit having one end connected to a bit line via a first selection gate transistor and the other end connected to a source line via a second selection gate transistor, wherein the device has a data write mode to boost a first boost channel region that contains a non-write selected memory cell and non-selected memory cells located closer to the first selection gate transistor than the selected memory cell, and a second boost channel region that contains non-selected memory cells located closer to the second selection gate transistor than the selected memory cell, both electrically separated from each other in the NAND cell unit, wherein in the data write mode a write non-selection voltage applied to a non-selected memory cell next to the second selection gate transistor is switched in accordance with the position of the selected memory cell in the NAND cell unit, at least in two stages, between a lower voltage V1 than a write non-selection voltage Vm applied to other non-selected memory cells in the NAND cell unit and a higher voltage V2 than the lower voltage (V1<V2≦Vm).

In a second aspect the present invention provides a non-volatile semiconductor memory device, comprising: a NAND cell unit including a plurality of electrically rewritable non-volatile memory cells serially connected, the NAND cell unit having one end connected to a bit line via a first selection gate transistor and the other end connected to a source line via a second selection gate transistor; and a dummy cell interposed next to the second selection gate transistor in the NAND cell unit, wherein the device has a data write mode to boost a first boost channel region that contains a non-write selected memory cell and non-selected memory cells located closer to the first selection gate transistor than the selected memory cell, and a second boost channel region that contains non-selected memory cells located closer to the second selection gate transistor than the selected memory cell, both electrically separated from each other in the NAND cell unit, wherein in the data write mode a write non-selection voltage applied to the dummy cell is switched and set in accordance with the position of the selected memory cell in the NAND cell unit.

BRIEF DESCRIPTION OF THE DRAWINGS

FIG. 3 shows a configuration of a NAND-type flash memory of an embodiment.

FIG. 15 shows bias relationships of the prior art in comparison with FIG. 14.

FIG. 16 shows a modification of the embodiment of the voltage application method of FIG. 14.

FIG. 20 shows a modification of the embodiment of the voltage application method of FIG. 18.

FIG. 21 shows a voltage application state in an embodiment designed to prevent failed write associated with a word line next to the selection gate line on the bit line side in addition to the embodiment of FIG. 18.

FIG. 22 shows a voltage application state in an embodiment having a dummy word line next to the selection gate line on the bit line side in addition to the embodiment of FIG. 21.

FIG. 23 shows a voltage application state in a modification of the embodiment of FIG. 22.

FIG. 24 shows a voltage application state in a modification of the embodiment of FIG. 23.

DETAILED DESCRIPTION OF THE EMBODIMENTS

Figure 1:
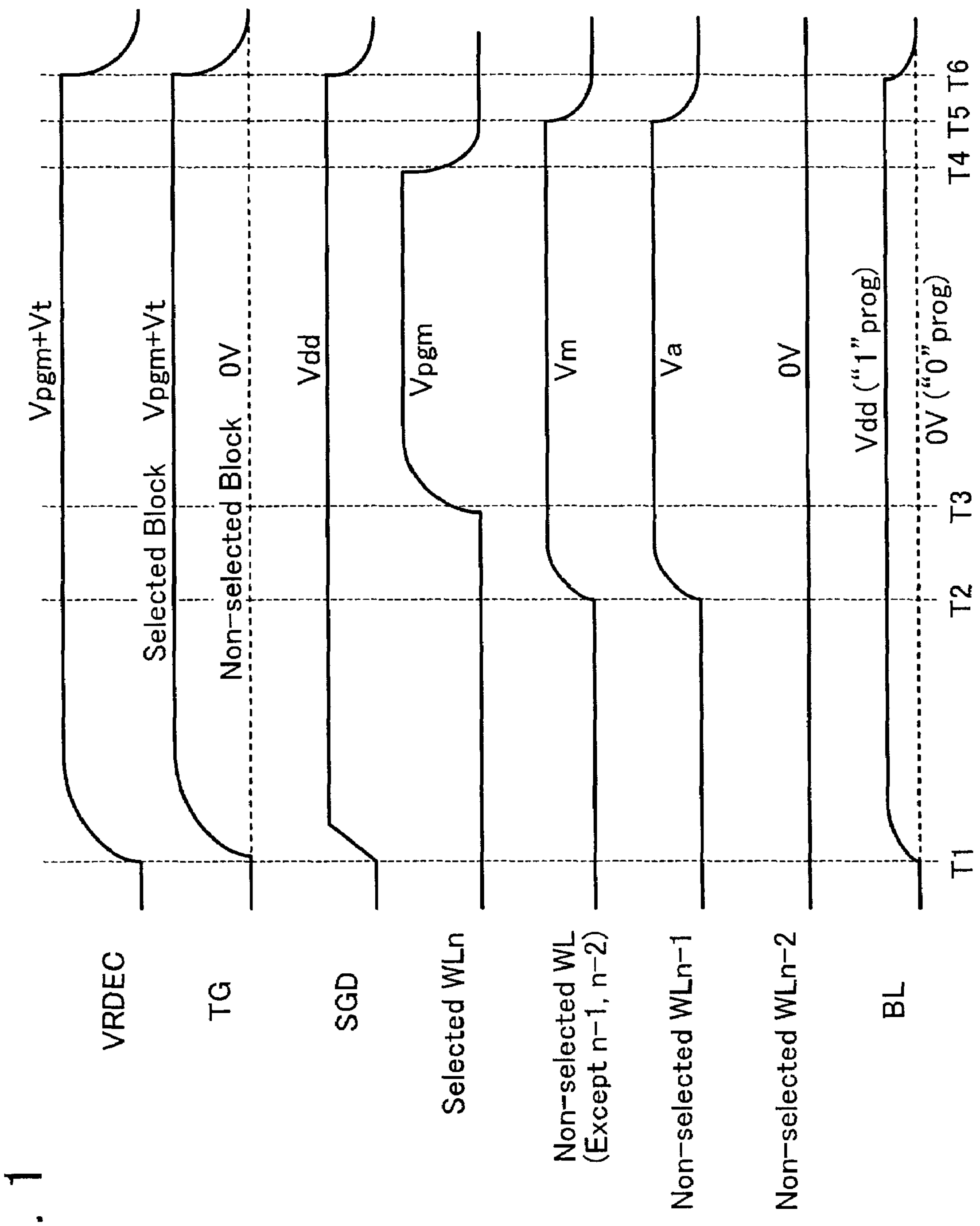
FIG. 1 shows an example of waveforms on write pulse application in a NAND-type flash memory.
Figure 2:
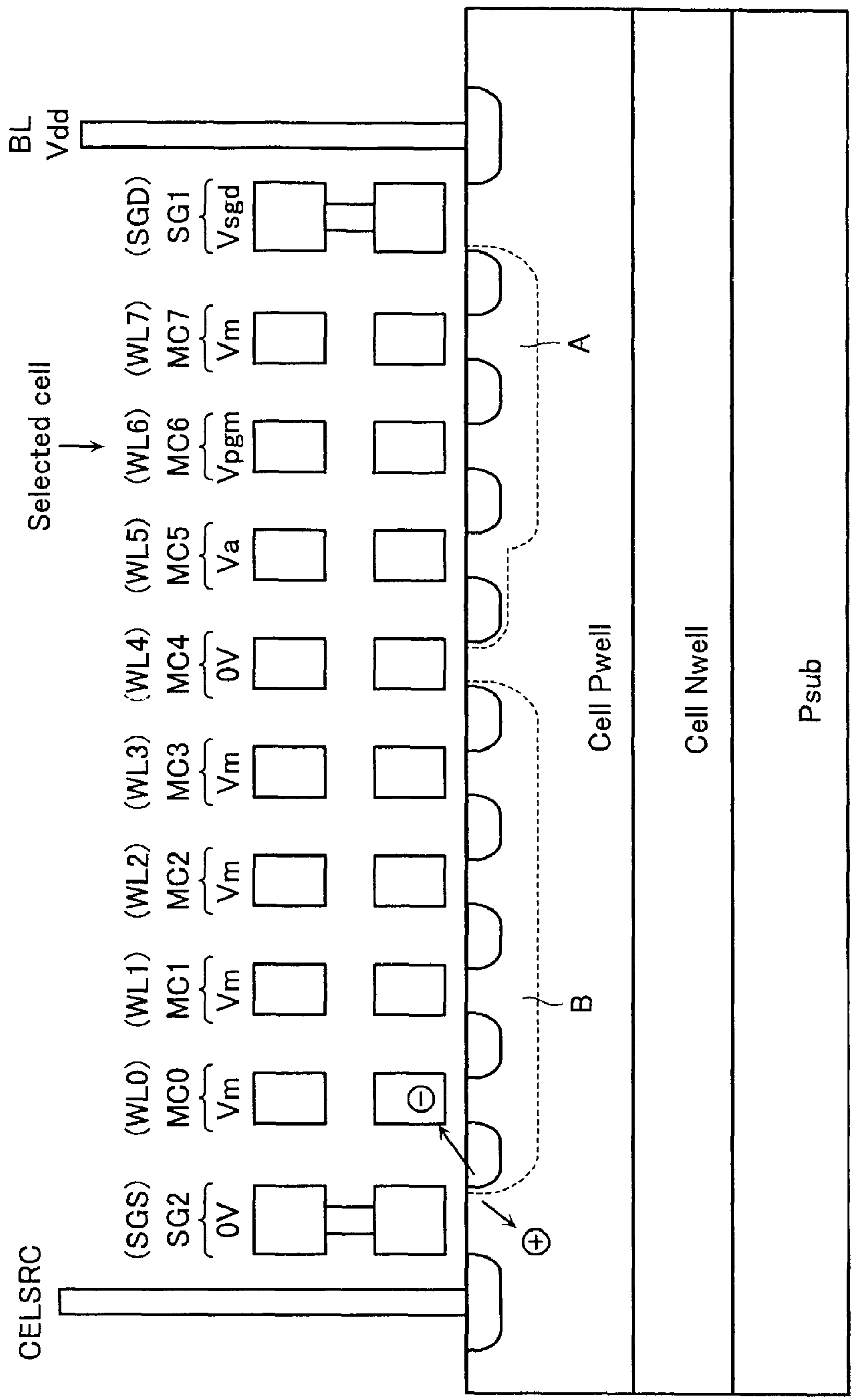
FIG. 2 shows bias relationships in a cross-sectional view of a NAND cell unit on the above write pulse application.

Prior to the description of the embodiments, a problem to be solved in the invention is described specifically. FIG. 1 shows an example of waveforms on write pulse application in a NAND-type flash memory. A selected word line WLn is supplied with a write voltage Vpgm (around 20 V) at a certain timing. Other non-selected word lines in the NAND cell unit (NAND string) that contains the selected word line are supplied with a voltage determined relative to the selected word line in accordance with a certain rule. Namely, with reference to the selected word line WLn, anon-selected word line WLn-1 located next to a source contact line (hereinafter simply referred to as "source line") is supplied with a voltage Va (=about 3 V). A non-selected word line WLn-2 located next but one to the source line is supplied with a channel separation voltage Vb (=0 V). Other non-selected word lines except these non-selected word lines WLn-1, WLn-2 are supplied with a write non-selection voltage (middle voltage) Vm (=about 8 V). FIG. 2 shows how such the write pulses are applied in a cross-sectional view of the NAND cell unit. For simplification of the description herein, the shown NAND cell unit includes eight memory cells M0-M7 serially connected and selection gate transistors SG1, SG2 arranged at both ends.

FIG. 2 shows a state of voltage application for "1"-write (non-write) where a memory cell MC6 (therefore, the word line WL6) is selected and the bit line BL is supplied with Vdd. As a result of applying the channel separation voltage 0V to a non-selected word line WL4, the channel regions and source/drain regions in the NAND cell unit are electrically separated in two and boosted. At a non-selected memory cell MC4 supplied with the channel separation voltage, a boost channel region A closer to a bit line contact line (hereinafter simply referred to as "bit line BL") is separated from a boost channel region B closer to the source line CELSRC as shown with dotted lines. The voltage applied to a selection gate line SGD on the bit line BL side is determined Vsgd=Vdd, for example.

In FIG. 2, when the channel and diffused layer regions are boosted through coupling with the word line, GIDL (Gate Induced Drain Leakage) current occurs in the edge of a selection gate transistor SG2 on the source line side. This current may cause failed write in an adjacent non-selected cell MC0 possibly as shown.

The shorter the distance between the selection gate transistor SG2 and the neighbor memory cell MC0, and the higher the middle voltage Vm applied to the word line WL0 associated with the non-selected memory cell M0, the easier this phenomenon arises. Failed write due to the above-described GIDL current arises in proportion to the increase in the number of word lines in the NAND cell unit.

The present invention has been proposed to prevent failed write due to GIDL current from arising in a non-selected memory cell next to the selection gate transistor SG2 on the source line side. At the same time, the possibility is taken into account about occurrences of other failed write due to the position of the selected cell.

The embodiments of the invention will now be described with reference to the drawings.

Embodiment 1

FIG. 3 is a brief diagram showing a general configuration of a NAND-type flash memory according to an embodiment. A NAND cell unit (NAND string) 100 is a basic unit in the NAND-type flash memory and includes a plurality of memory cells MC0-MC31 serially connected and two selection gate transistors SG1 and SG2 arranged at both ends. Namely, the NAND cell unit 100 has one end connected via the selection gate transistor SG1 to a bit line BL and the other end connected via the selection gate transistor SG2 to a common source line CELSRC in a memory array 102.

A memory cell includes an N-type source/drain diffused layer formed in a P-type well in a silicon substrate and has a stacked gate structure with a floating gate serving as a charge accumulating layer and a control gate as well known. The amount of charge retained in the floating gate can be varied through write or erase operation to change the threshold of the memory cell, thereby storing one-bit or multi-level-bit data.

In the NAND cell unit 100 the control gates of the memory cells are connected to the respective word lines WL0-WL31 and the gates of the selection gate transistors SG1, SG2 are connected to the respective selection gate lines SGD, SGS.

The word lines WL0-WL31 and the selection gate lines SGD, SGS are shared among a set of NAND cell units, which form a block 101 that serves as a unit for data batch erase. Usually, plural blocks 101 are arranged in the bit line direction as shown.

The NAND-type flash memory realizes various operations in accordance with command inputs. For example, in write operation, a data load command is latched from an I/O circuit 1 to a command register 2, and a write address is latched via the I/O circuit 1 to an address register 3. Subsequently, write data is loaded via the I/O circuit 1 into a sense amp circuit (and write circuit) 30. Thereafter, a write execution command is latched via the I/O circuit 1 to the command register 2 to start write operation automatically inside the device.

Namely, on receipt of the write execution command, a sequence controller 4 starts operation. In write operation, the sequence controller 4 controls voltages required for write operation, controls timings of write pulse application and verify-read operation, and controls repetition of write pulse application until completion of desired write operation and verify-read operation.

A high-voltage generator 5 is controlled by the sequence controller 4 to generate the write voltage Vpgm, the write middle voltage Vm, and other high voltages (boosted voltages) required in a row-related signal driver 20 and a page buffer controller 6.

The row-related signal driver 20 includes CG decoders/drivers 24 to control the voltages on the word lines, a SGD driver 22 provided to control the selection gate line SGD on the drain side, a SGS driver 22 provided to control the selection gate line SGS on the source side, and a VRDEC driver 21 provided to supply a boosted power voltage VRDEC for the block decoder. The number of the CG decoders/drivers 24 is equal to that of word lines in the NAND cell unit. These drivers 21-24 are shared among plural blocks.

The NAND-type flash memory is required to apply plural voltages on plural word lines in the selected NAND cell unit. Accordingly, among row addresses, a page address is given to the CG decoders 24 to select the word lines in the NAND cell unit.

Each block 101 in the memory cell array 102 has a word line end with a row decoder 10 in a narrow sense having a block selecting function arranged thereon. The row decoder 10 includes a block decoder 11 operative to receive a block address from the address register 3 and decode it, and transfer transistors 12 controlled under the output from the block decoder 11. The transfer transistors are used to transfer the voltages required for write, erase and read to the word lines and selection gate lines in the selected block. The block decoder 11 includes a level shifter for supplying a desired voltage to the common gate TG of the transfer transistors 12.

The transfer transistors 12 each have one end connected to respective one of the outputs of the drivers 21-24 and the other end connected to respective one of the word lines and selection gate lines in the cell array. For example, in write pulse application, it is required to apply the write voltage Vpgm (around 20 V) to the selected word line. At the same time, the transfer transistor 12 is supplied on the common gate TG with Vpgm+Vt (Vt is a voltage corresponding to the threshold of the transfer transistor 12), which is fed from the VRDEC driver 21.

The NAND-type flash memory uses FN tunneling current in write and erase. In particular, in write operation, the current required for shifting the threshold of one memory cell is extremely small, different from the NOR-type. Accordingly, it is possible to execute simultaneous write to a number of memory cells. Therefore, the page length of a batch processing unit for write and read can be made as large as 2K bytes or 4K bytes. Sense units 31 in the sense amp circuit 30 that configure a page buffer are contained by the same number as the page length.

A column decoder 7 decodes a column address sent from the address register 3, for example, on loading write data, to connect the I/O circuit 1 to the selected sense unit 31 and set write data on the column address in the sense amp circuit 30. In contrast, in read operation, data batch-read into the page buffer 30 is fed from the sense unit 31 selected in accordance with the column address to the I/O circuit 1.

Although not shown in FIG. 3, in practice, some circuits are inserted between the I/O circuit 1 and the page buffer 30 to realize the input/output of data at a certain cycle.

Figure 4:
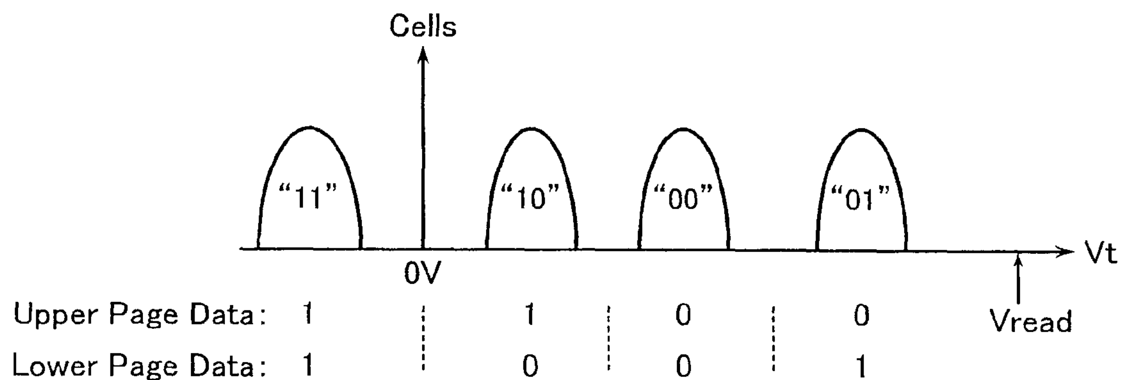
FIG. 4 shows a data threshold distribution for four-level data storing.

FIG. 4 shows relationships between the state of a memory cell threshold and the data when a four-level data-storing scheme is applied. In this example, two bits of data stored in one memory cell are allocated to two row addresses. Namely, a lower bit is data to be read out when a lower page is selected. An upper is data to be read out when an upper page is selected.

An erased state with a negative threshold corresponds to data "11", and written states with positive thresholds corresponding to data "10", "00", "01" are defined in order of threshold.

Figure 5:
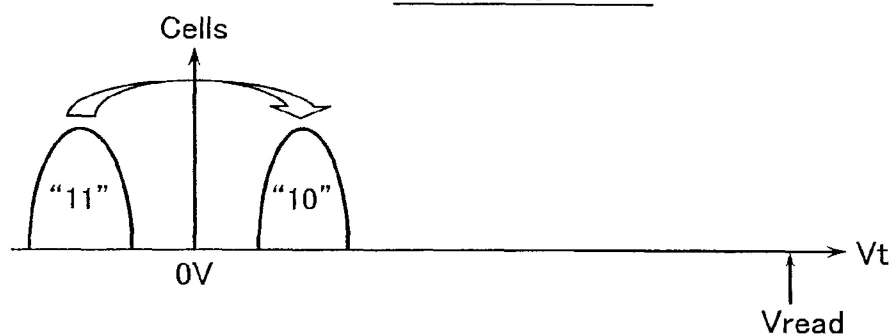
FIG. 5 illustrates lower page write operation.
Figure 6:
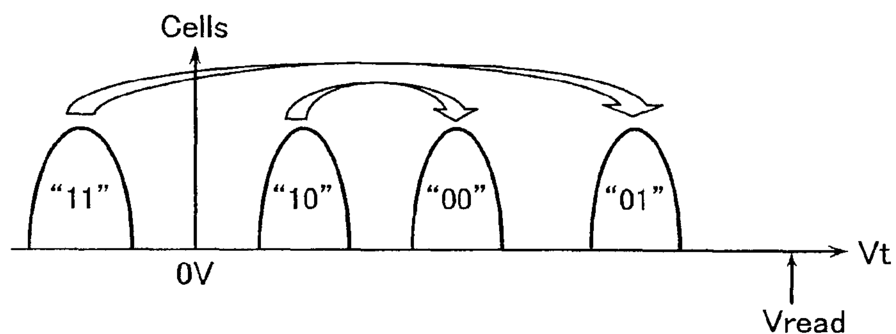
FIG. 6 illustrates upper page write operation.

An example of the writing method in such the data allocation is shown in FIGS. 5 and 6. FIG. 5 shows a method of writing lower page data. Selective "0"-write to the memory cell in the erased state of data "11" can provide a threshold distribution for data "10". At this time, the "1"-written cell has the threshold not shifted and retains the state of data "11".

FIG. 6 illustrates how upper page write is executed. If upper page data requires "0"-write to the cell with data "11", the threshold is shifted from data "11" to data "01". If upper page data requires "0"-write to the cell with data "10", the threshold is shifted from data "10" to data "00". If it is "1"-write data, respective threshold distributions of data "11" and "10" are retained.

The four-level data-storing scheme requires an execution of lower page write prior to upper page write.

The write for four-level storing needs the creation of three write threshold states as shown in FIG. 4, and requires write to a higher threshold state than the binary storing scheme. Therefore, it is required to sufficiently suppress failed write in the "1"-write state with the threshold not shifted.

Figure 7:
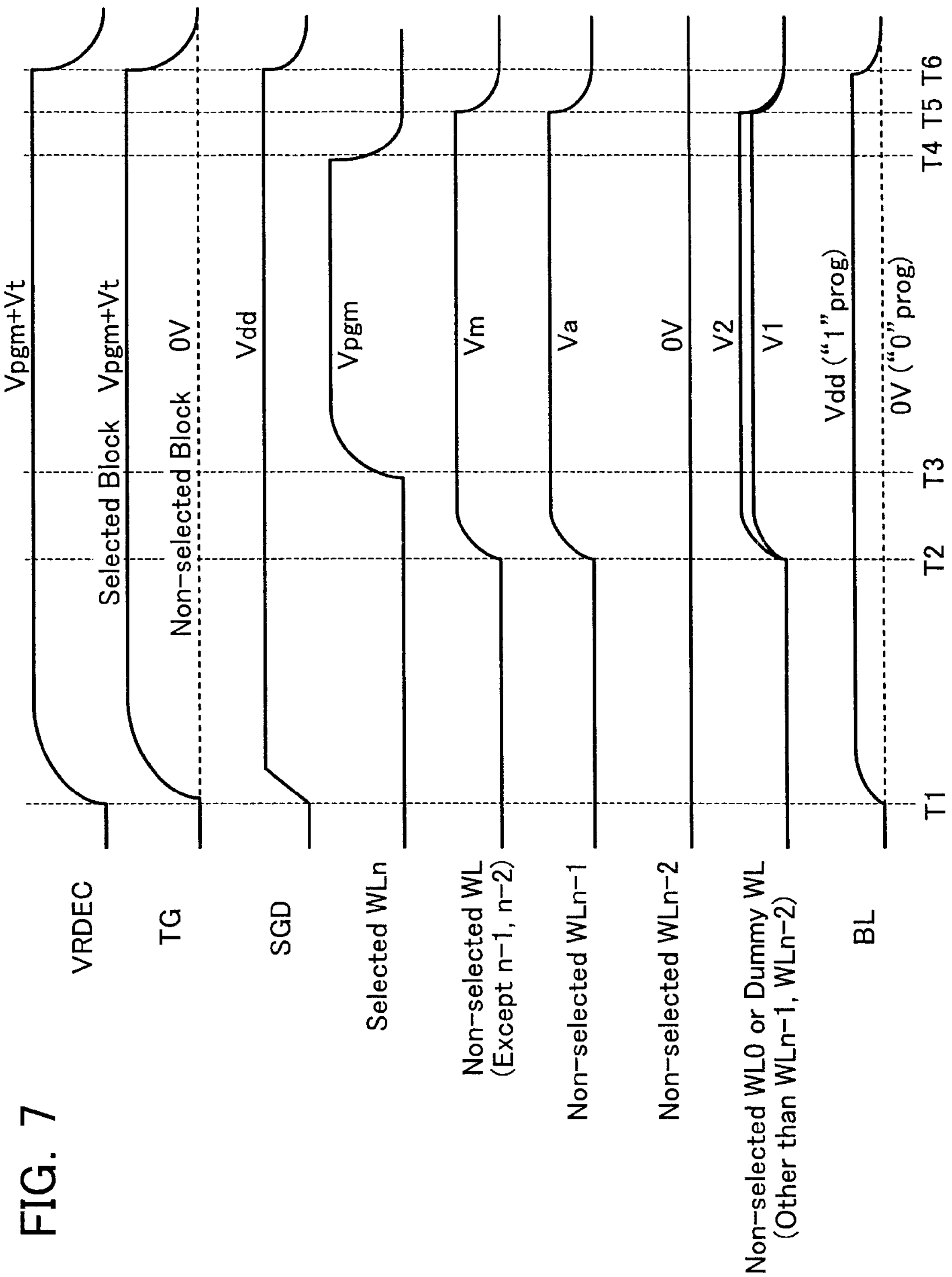
FIG. 7 shows waveforms on write pulse application in the present embodiment.

FIG. 7 shows waveforms on write pulse application in the present embodiment in comparison with FIG. 1. A selected word line WLn is supplied with a write voltage Vpgm at a certain timing T3. A non-selected word line WLn-2 located adjacent to the source line with one word line therebetween is supplied with a channel separation voltage Vb=0 V. A non-selected word line WLn-1 located next to the source line is supplied with a voltage Va (about 3 V) similar to FIG. 1.

The previous rule of voltage application relative to the selected word line is not limited to this form. For example, between the selected word line and a non-selected word line supplied with the channel separation voltage Vb, plural non-selected word lines supplied with Vm may be sandwiched or word lines supplied with a voltage other than Va, Vb, Vm may be sandwiched.

In FIG. 7, VRDEC denotes a boosting power source for the block decoder 11 as described in FIG. 3, and TG denotes a common gate of the transfer transistor array 12. In the selected block, Vpgm+Vt is applied to the common gate TG such that the write voltage Vpgm can be transferred to the selected word line in the block.

It is the characteristic in FIG. 7 that the non-selected memory cell MC0 next to the selection gate transistor SG2 on the source line side is supplied with write non-selection voltages V1, V2. These voltages are equal to or lower than the write middle voltage Vm (V1<V2≦Vm) and switched in accordance with the position of the selected memory cell. This point is described specifically below.

Figure 8:
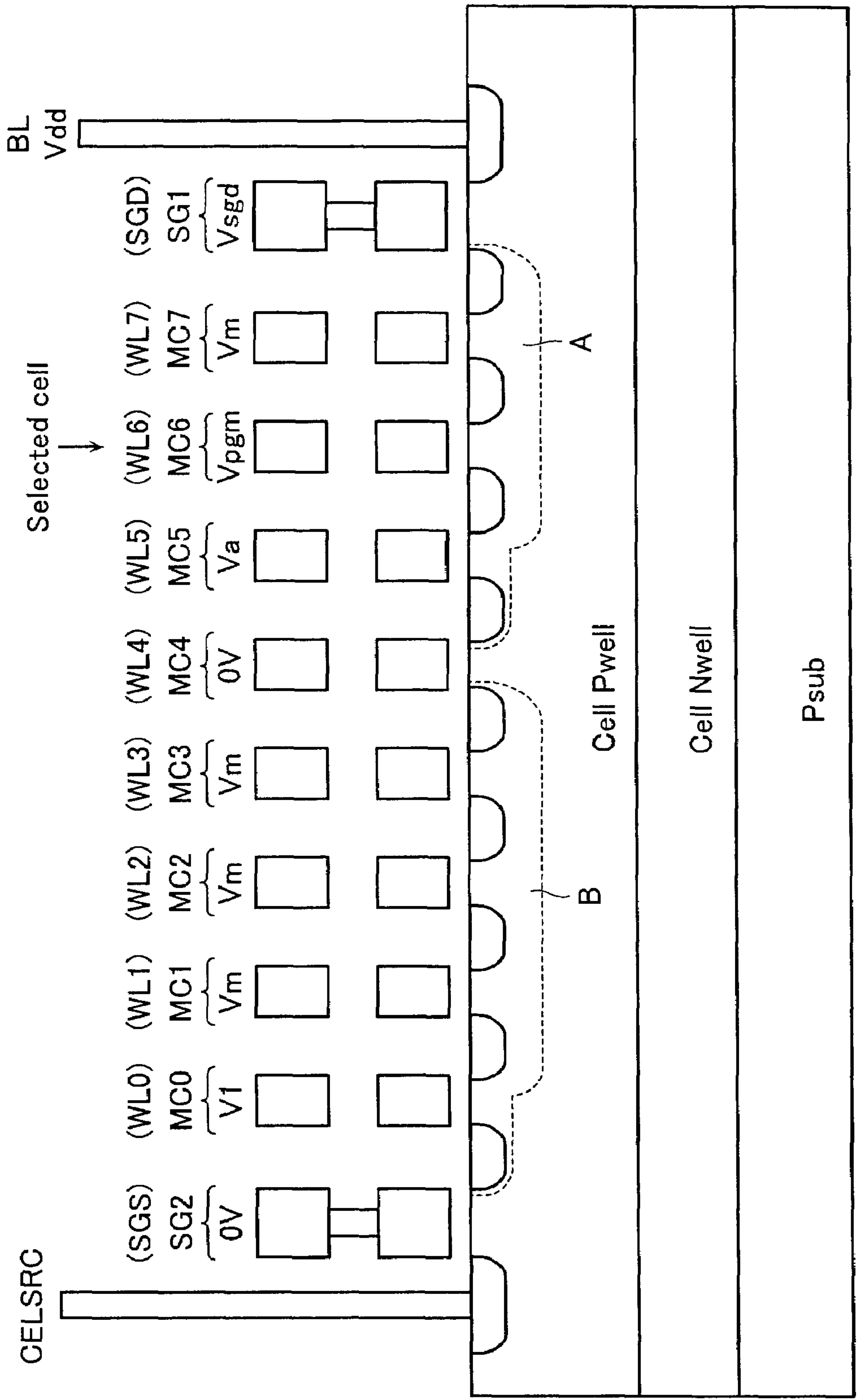
FIG. 8 shows a voltage application state in a cross-section of the NAND cell unit in comparison with FIG. 2 on "1" write to a memory cell MC6 selected.

FIG. 8 shows a voltage application state in a cross-section of the NAND cell unit in comparison with FIG. 2 on "1" write (non-write with the threshold unchanged) to the memory cell MC6 (therefore, the word line WL6) selected. In principle, similar to FIG. 2, the first boost channel region A on the bit line side is separated from the second boost channel region B on the source line side.

Different from FIG. 2, among non-selected memory cells, the non-selected memory cell MC0 next to the selection gate transistor SG2 on the source line side is supplied not with the write middle voltage Vm but with a lower voltage V1 (V1<Vm).

The GIDL current caused in the drain edge of the selection gate transistor SG2 influences on the memory cell MC0 actually in two ways. One is related to a case where the memory cell MC0 (the word line WL0) is selected and the write voltage Vpgm is applied thereto. Another is related to a case where another word line is selected and the write middle voltage Vm is applied as shown in FIG. 2. In the former, the number of selections of the word line WL0 for write out of all word lines is equal to one or two in multi-level write operation, while the latter is the case where another word line is selected and the number of write pulses which may cause GIDL is in proportion to the number of cells in the NAND string.

It is considered in this embodiment to reduce the influence in the latter. For that purpose, it is effective to apply the voltage V1 lower than the write middle voltage Vm to the word line WL0 when it is not selected as shown in FIG. 8. As a result, it is possible to restrict the voltage transferred to the drain of the selection gate transistor SG2, and thus suppress failed write to the non-selected memory cell MC0 due to GIDL current in the selection gate transistor SG2.

If the word line WL0 is not selected, however, the voltage V1 is not always suitable. For example, if the word line WL3 (therefore the memory cell MC3) located closer to the source line than FIG. 8 is selected as shown in FIG. 9, a further fear of failed write arises.

In this case, as the word line WL2 is supplied with Va and the word line WL1 is supplied with the channel separation voltage 0V, there is only one word line WL0 left closer to the source line than the word line WL1 supplied with 0V. At this moment, the boost channel region B can not be boosted sufficiently with the voltage V1 and the potential on the source of the memory cell MC1 (that is, the diffused layer closer to the memory cell MC0) becomes insufficient to cut of f the memory cell MC1. Thus, a leakage to the memory cell MC0 occurs from the channel region closer to the bit line than the memory cell MC2 boosted sufficiently. When the write voltage Vpgm is applied to the selected word line, this leakage may serve as a trigger to generate a hot carrier in the drain end of the memory cell MC2. In this case, the hot carrier is injected into the floating gate in the memory cell MC3 to cause failed write.

Thus, as the position of the non-selected word line supplied with the channel separation voltage 0V gets close to the selection gate transistor SGS on the source line side (that is, the number of cells in the second boost channel region B decreases), channel boost on the source line side becomes insufficient in the system that applies the lower voltage V1 to the word line next to the selection gate transistor on the source line side, resulting in unexpected charge transfer. To prevent this charge transfer, the non-selected word line WL0 is supplied with a higher voltage V2 (≦Vm) instead of the voltage V1.

Figure 9:
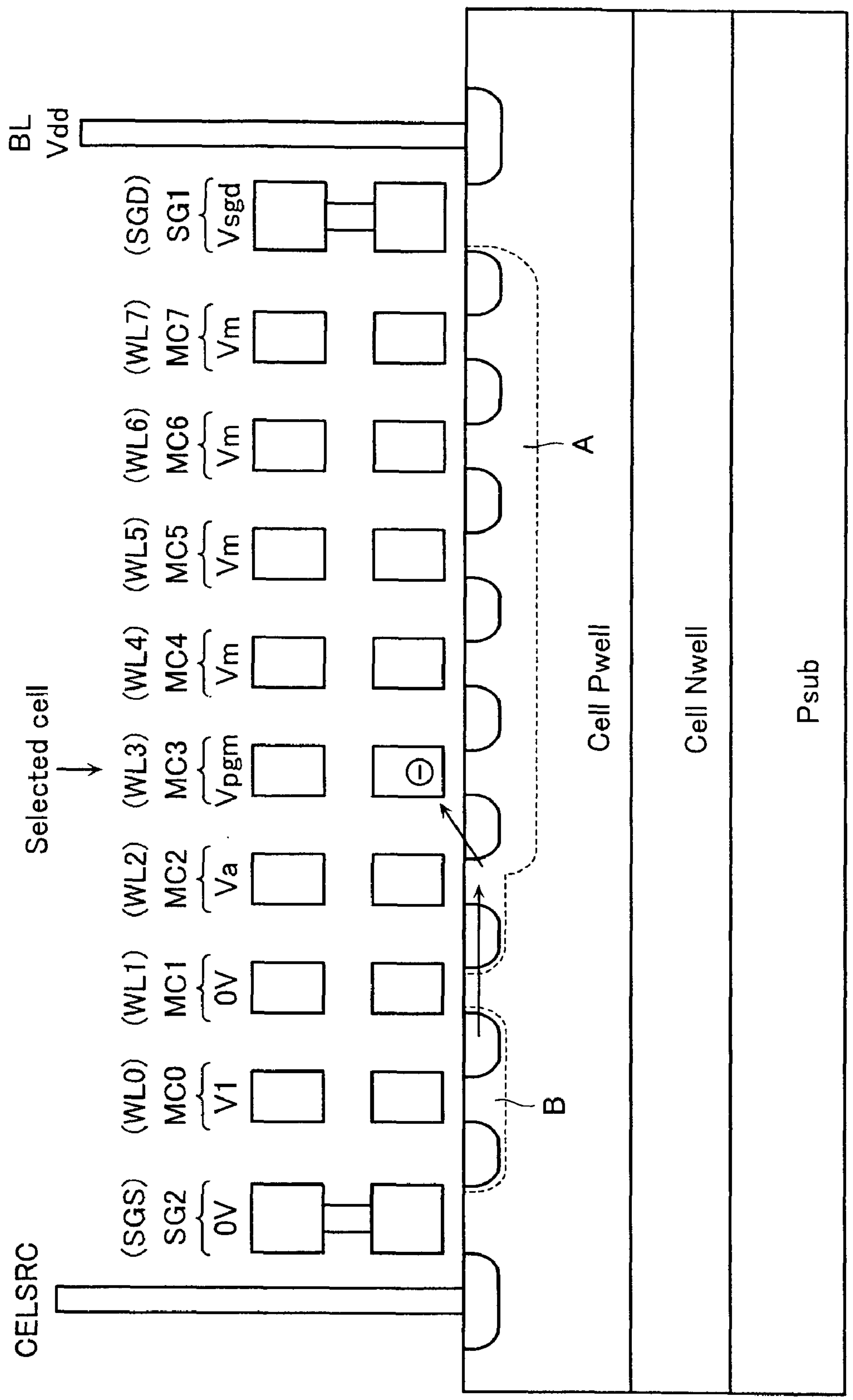
FIG. 9 shows the risk of failed write under the bias condition of FIG. 8.
Figure 10:
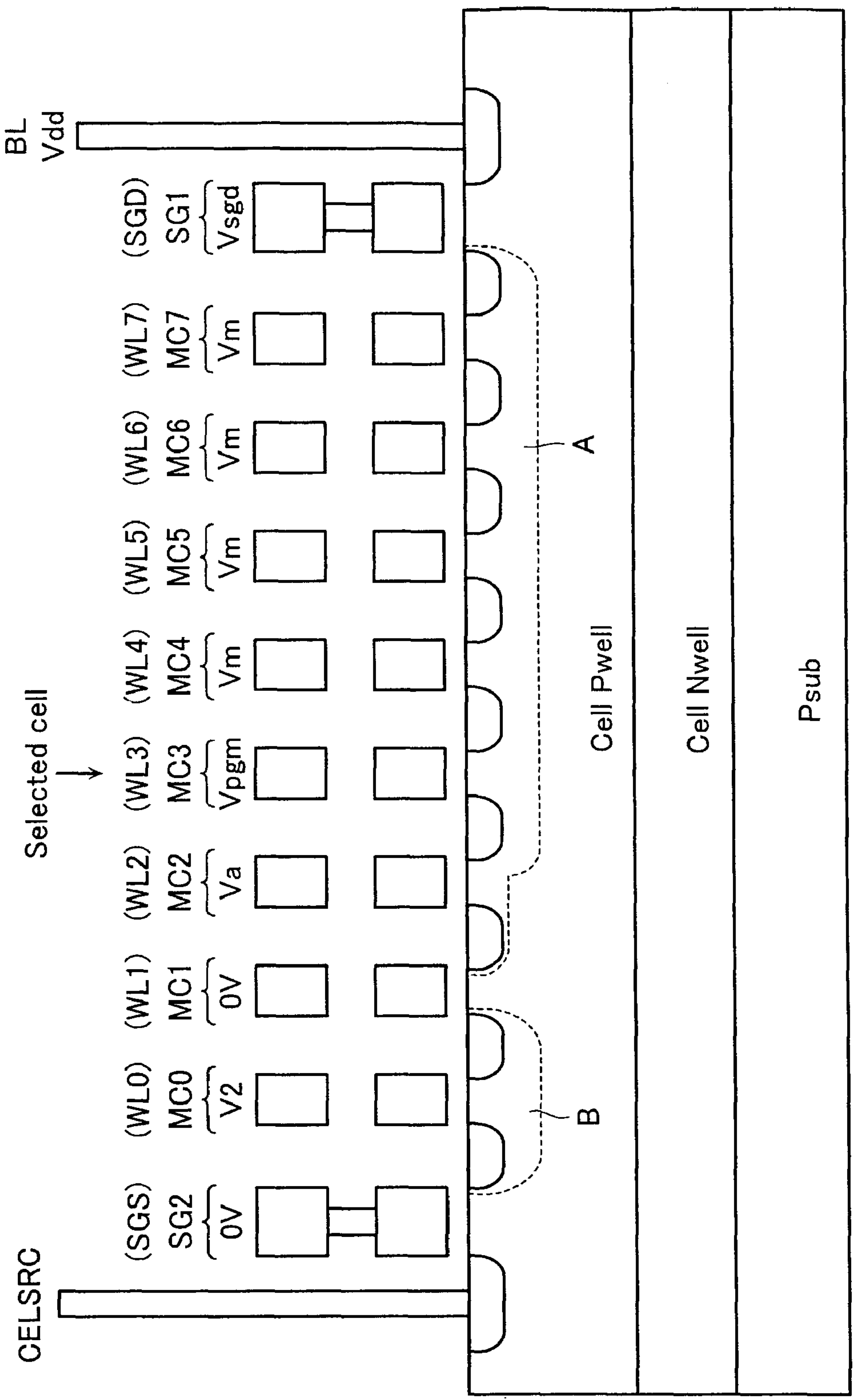
FIG. 10 shows a bias condition to avoid the above risk.
Figure 11:
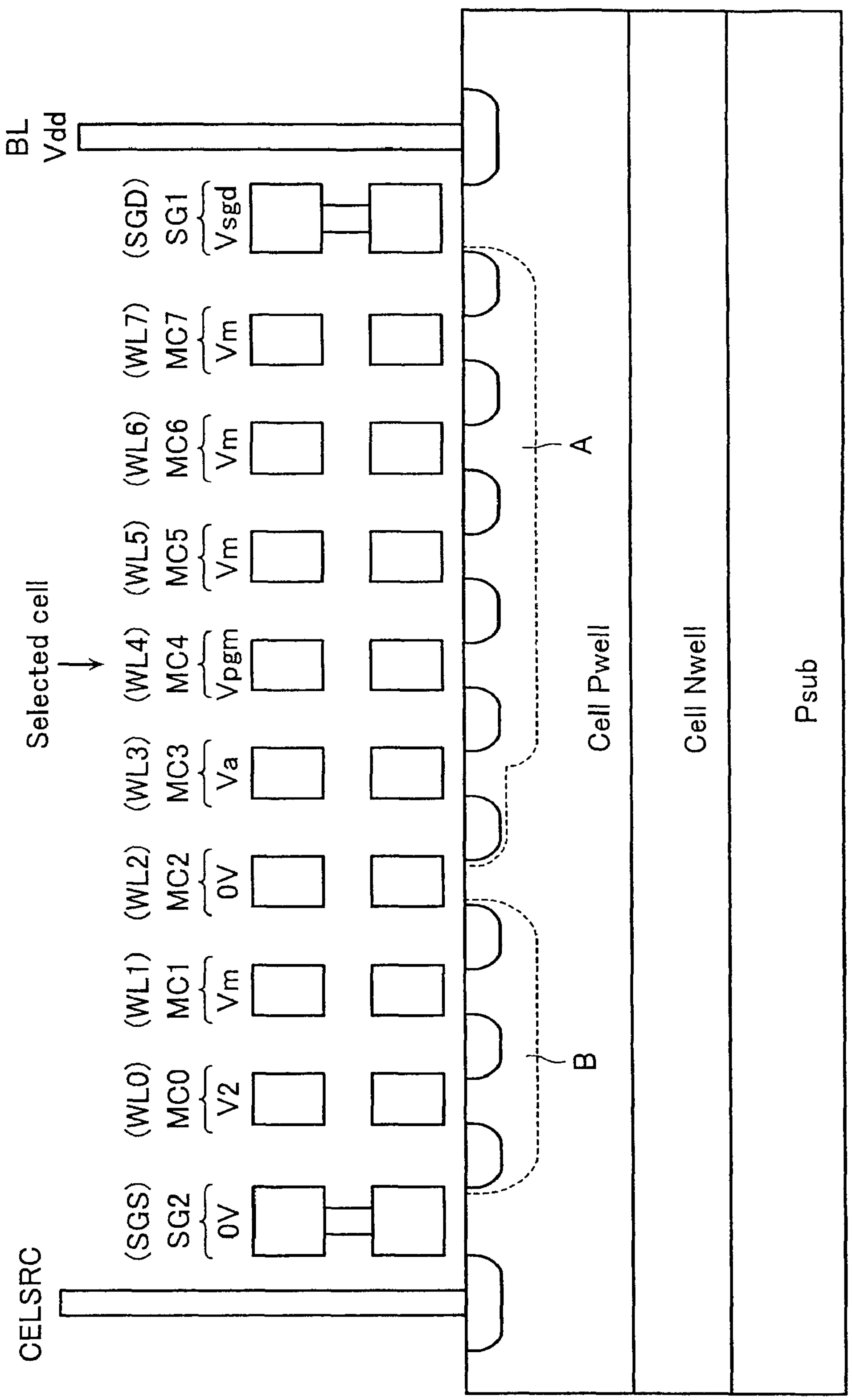
FIG. 11 shows a case where a voltage V2 is applied to a word line WL0 next to a selection gate line SGS.

FIG. 10 shows a state where the voltage V2 (>V1) is applied to the non-selected word line WL0 next to the selection gate transistor SGS in the state of word line selection of FIG. 9. FIG. 11 shows a case where the selected word line is shifted by one step (line) toward the selection gate line SGD relative to FIG. 10, that is, the word line WL4 is selected. Also in this case, the word line WL0 is supplied with the voltage V2.

Figure 12:
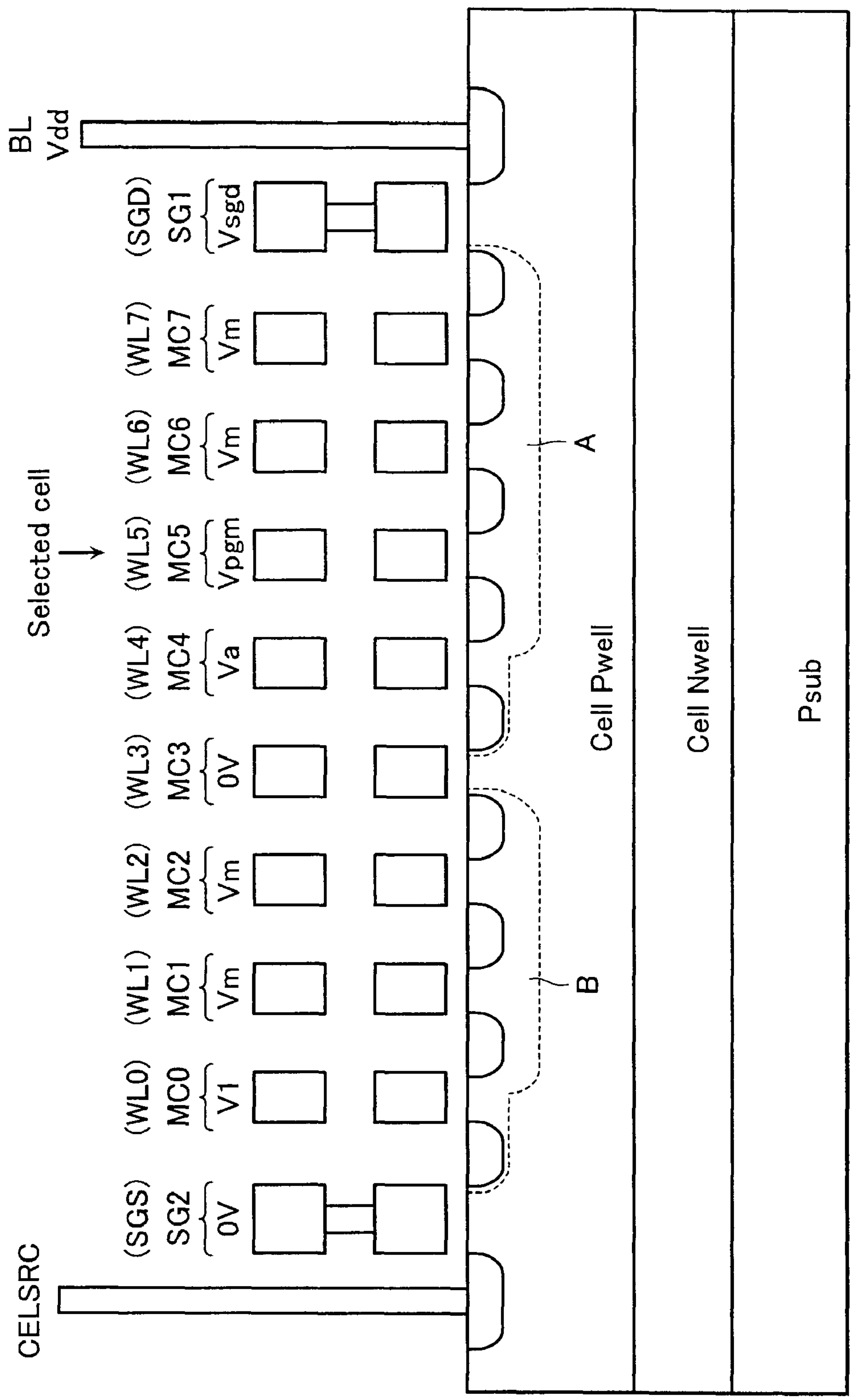
FIG. 12 shows a case where a voltage V1 is applied to the word line WL0 next to the selection gate line SGS.

FIG. 12 shows a case where the position of the selected word line is shifted additionally by one step (line) toward the selection gate line SGD on the bit line side. In this case, the word line WL0 is supplied with the voltage V1. Namely, there are three non-selected word lines WL0-WL2 closer to the source line than the word line WL3 supplied with the channel separation voltage 0V. Accordingly, the two word lines WL1-WL2 are supplied with the write middle voltage Vm and the remaining one WL0 with the voltage V1.

As described above, when the number of non-selected memory cells located closer to the source line than the non-selected memory cell supplied with the channel separation voltage Vb=0V reaches a certain number or more (three or more in this example) the voltage V2 is switched to the voltage V1. In other words, the number of non-selected word lines located closer to the source line reaches five or more, the voltage V2 is switched to the voltage V1.

As a result, it is made possible to prevent failed write due to the GIDL current in the selection gate transistor SG2 as described in FIG. 2. It is also possible to sufficiently boost the channel on the source line side even if the selected word line is close to the source line to prevent failed write in the selected cell through the hot carrier injection as described in FIG. 9.

Figures 13, 14:
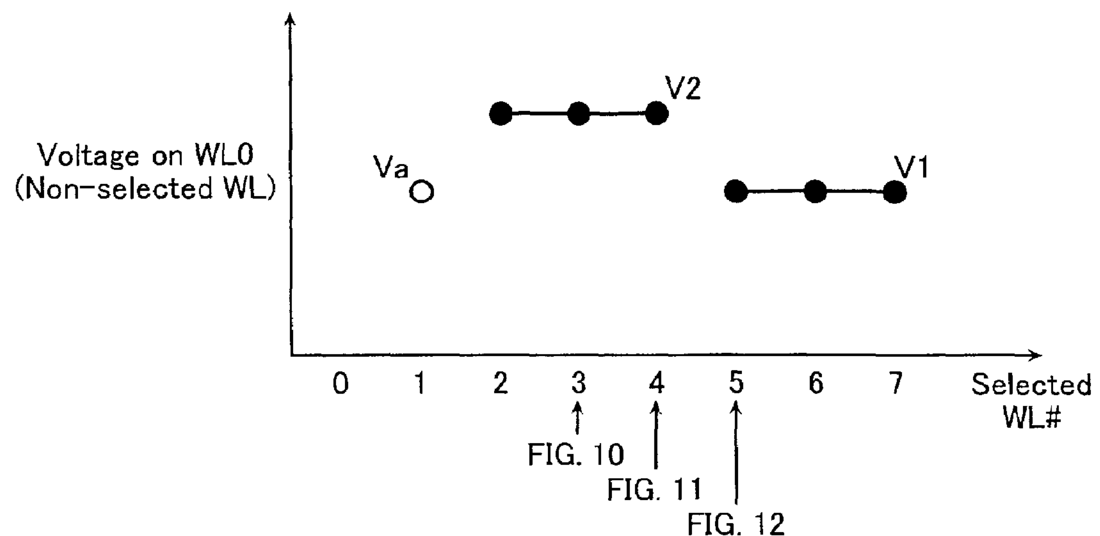
FIG. 13 shows how the voltages V1, V2 are selected in accordance with the position of the selected word line.
FIG. 14 similarly shows how the voltages V1, V2 are selected in accordance with the position of the selected word line in relation to other word lines in summary.

In this embodiment, the position of the selected word line (the word line number given from the source line side in order) is shown along the lateral axis and the voltage applied to the non-selected word line WL0 is shown along the vertical axis as in FIG. 13. FIG. 14 shows voltages applied to word lines in relation to the position of the selected word line in summary.

WL0 is supplied with V2 even when the selected word line is WL2 because of the fear of failed write as described with reference to FIG. 9. When the selected word line is WL1, V2 may be applied to WL0 though Va is still applied thereto. This is based on a consideration that the upper and lower non-selected word lines next to the selected word line exert the influence on the write characteristic of the selected cell, and accordingly the similar condition of voltage application is used preferably to retain the voltage on the floating gate in the selected cell almost constant.

In other words, in this embodiment, the write non-selection voltage applied to the non-selected memory cell next to the selection gate transistor SG2 on the source line side is switched under the following rule. That is, it is switched to a first voltage V1 (Vb<V1≦Vm) when the selected memory cell locates within a certain first region set in the NAND cell unit closer to the selection gate transistor SG1 on the bit line side. Moreover, it is switched to a second voltage V2 (Vb<V1<V2≦Vm) when the selected memory cell locates within a second region set closer to the selection gate transistor SG2 than the first region. This rule is different from the voltage application rule in which voltages Vb and Va are applied to the non-selected memory cell on the source line side near the selected memory cell.

Further in other words, to prevent failed write to the cell next to the selection gate line SGS on the source line side, the voltage applied to the word line WL0 when it is not selected uses V2 when the selection gate line is contained within a range of WL2-WL4 closer to the selection gate transistor SG2

(that is, the number of non-selected cells in the second boost channel region B is equal to 0-2), and V1 when the selected word line is contained within a range of WL5-WL7 much closer to the selection gate transistor SGD (that is, the number of non-selected cells in the second boost channel region B is equal to 3 or more). When the selected word line is WL1, the adjacent non-selected word line WL0 on the source line side is supplied with the voltage Va.

FIG. 15 shows a conventional method of applying the middle write voltage Vm to a non-selected word line located closer to the source line than the word line supplied with the channel separation voltage 0V in comparison with FIG. 14.

FIG. 16 shows another one that uses Va instead of V2 as the voltage on the word line WL0 when the word line WL1 is selected in the example of FIG. 14. If the word line WL0 or WL31 next to the selected word line is actually selected, even the use of the same write voltage Vpgm results in a different write characteristic from that when other word lines are selected. It is herein important for the NAND-type flash memory to prevent the selected word line from extremely varying the write time.

The write operation includes the write pulse application and the following write-verify operation, which are repeated until write-targeted cells all exhibit a desired threshold voltage as described above. The repetition of write uses a step-up write method that increases the write voltage at certain increments. The repetition number of write is called the number of write loops.

On write to any word line with the use of the write voltage Vpgm, a write voltage is determined in accordance with a fast write word line to prevent excessive write. It means that the write voltage lowers for a cell with a slow-write word line. As for the slow-write word line, write operation starts with a condition where a data write is difficult. Accordingly, the number of write loops increases to elongate the write time.

In order to solve this problem, the following method is effective. Specifically, for example, a selected word line is given a write voltage adjusted in accordance with the write speed to the selected word line, thereby giving almost the same number of write loops to any word lines.

When such the write technology is employed, there is no difficulty if the voltages on the upper and lower word lines next to the selected word line supplied with the write voltage Vpgm differ from the states of other selected word lines. Therefore, as shown in FIG. 16, the voltage applied to the word line WL0 may be switched to V2 when WL1-WL4 is selected.

Embodiment 2

As measures directed to the prevention of failed write due to the GIDL current in the selection gate transistor S02 on the source line side at the time of "1" write as described in FIG. 2, a dummy cell MCD (dummy word line WLD) interposed next to the selection gate transistor SG2 is considered an effective means.

Figure 17:
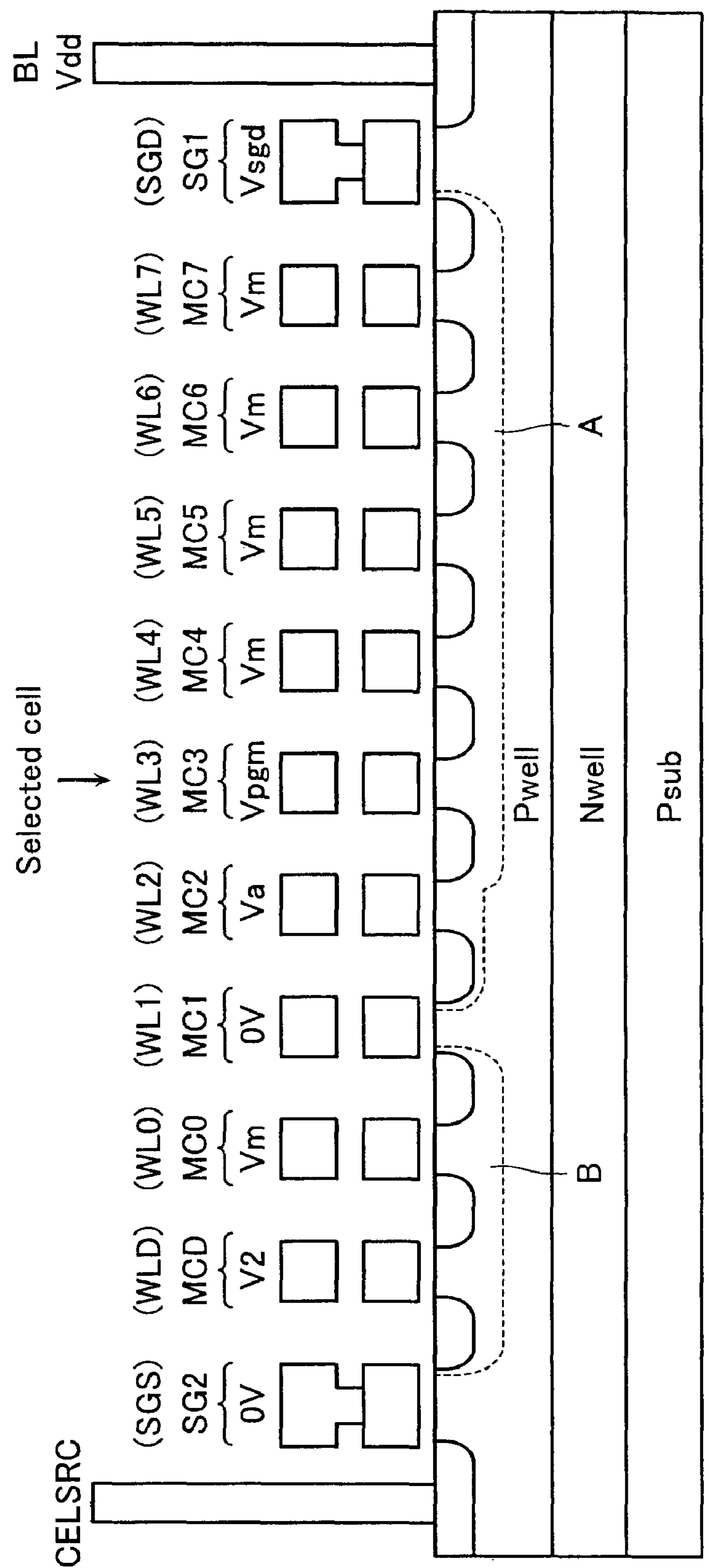
FIG. 17 shows a voltage application state in a cross-section of the NAND cell unit in an embodiment having a dummy word line next to the selection gate line on the source line side.

FIG. 17 shows a state of write voltage application when a memory cell MC3 (word line WL3) is selected with respect to an embodiment where such the dummy cell MCD is interposed. Also in this case, there are eight memory cells MC0-MC7 except the dummy cell MCD similar to the preceding embodiments and respective control gates are connected to the word lines WL0-WL7 as shown.

When the memory cell MC3 is selected, a non-selected memory cell MC2 adjacent thereto on the source line side is given Va. A non-selected memory cell MC1 next to MC2 on the source line side is given the channel separation voltage Vb (=0 V). A non-selected memory cell MC0 next to MC1 on the source line side is given the write middle voltage Vm (<Vpgm).

In this embodiment, the dummy cell MCD is given the voltage V1 or V2 required for suppressing GIDL current in the selection gate transistor SG2. In the case of FIG. 17, there is only one non-selected memory cell supplied with the middle write voltage Vm located closer to the source line than the memory cell MC1 for channel separation. Accordingly, the dummy cell MCD is given the relatively higher voltage V2 ($Vb<V2\leqq Vm$).

In this way, application of the voltage V2 to the dummy cell MCD can elevate the boosted potential on the boost channel region B and improve the cut-off characteristic of the memory cell MC1. As a result, it is possible to suppress an occurrence of failed write triggered by the current leaking through the memory cell MC1. In the case of FIG. 17, it is possible to apply the write middle voltage Vm to the non-selected memory cell MC0 next to the non-selected memory cell MC1 given the channel separation voltage Vb. Therefore, the cut-off characteristic of the memory cell MC1 is made desirable to a certain extent because the Vm-applied cell is contained.

Figures 18, 19:
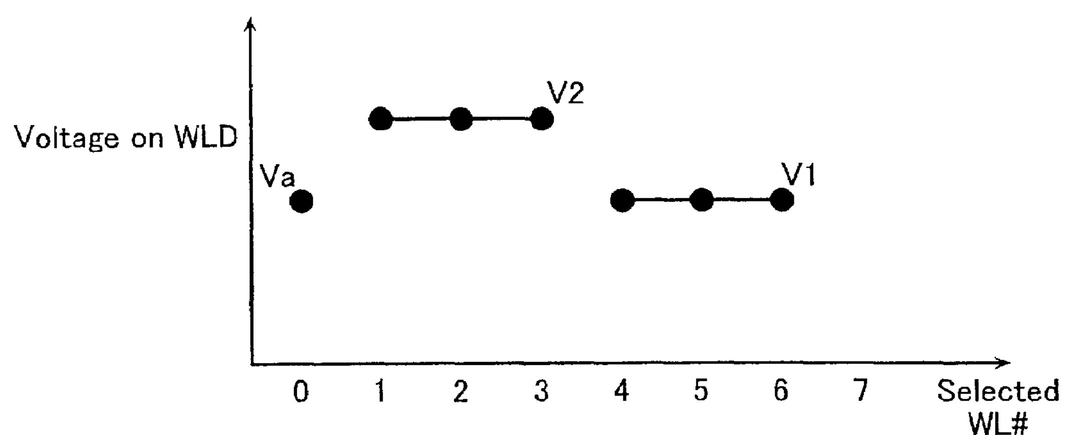
FIG. 18 shows how the voltages V1, V2 are selected in accordance with the position of the selected word line in the same embodiment in relation to other word lines in summary.
FIG. 19 shows how the voltages V1, V2 are selected in accordance with the position of the selected word line in the same embodiment in comparison with FIG. 13.

FIG. 18 shows voltages applied to word lines in relation to the position of the selected word line in summary. FIG. 19 shows relationships between the position of the selected word line and the voltage on the dummy word line.

If the selected word line falls within a range of WL1-WL3 (that is, the number of non-selected cells containing the dummy cell in the second boost channel region B is equal to 0-2), then the dummy word line WLD is given the voltage V2. This makes it possible to prevent failed write in the selected memory cell through the hot carrier injection from the source side as described in FIG. 9.

If the selected word line is WL0, then the dummy word line WLD is given the voltage Va. If the selected word line is WL4 or much closer to the bit line side (that is, the number of non-selected cells containing the dummy cell in the second boost channel region B is equal to 3 or more), then the voltage applied to the dummy word line WLD is switched to V1 that is lower than V2.

In other words, if the selected word line is WL4 or much closer to the bit line, it is possible to ensure two or more non-selected word lines that locate closer to the source line side than the word line supplied with the channel separation voltage Vb=0V and that can be supplied with the middle voltage Vm. Therefore, the voltage applied to the dummy word line is lowered below V2 and set at V1. This makes it possible to surely cut off the memory cell for channel separation and makes it more difficult to cause failed write due to GIDL in the dummy cell itself with the use of the lower voltage V1.

FIG. 20 uses V2 in place of Va for the voltage on the dummy word line DWL when the word line WL0 is selected in the example of FIG. 18. As described in FIG. 16, even though the voltages applied to the upper and lower word lines next to the selected word line differ from each other, the write voltage Vpgm can be adjusted to control the write speed. In such the case, the application range of the voltage V2 can be set to the range of the selected word line WL0-WL3 in this way (that is, the number of non-selected cells in the second boost channel region B is equal to 2 or less). In this case, it is not required to apply the voltage Va to the dummy word line and the dummy word line voltage controller can be simplified.

Embodiment 3

There is a fear of failed write due to GIDL even in a memory cell along the word line next to the selection gate line SGD on the bit line side other than the word line WL0 next to the selection gate line SGS on the source line side.

FIG. 21 shows a modification of FIG. 20 with respect to an embodiment taking this point into account. The word line next to the selection gate line SGD in this example is WL7. If a word line within a range of WL0-WL5 is selected, the word line WL7 next to the selection gate line SGD is given not the write middle voltage Vm but a lower voltage V3 (V1≦V3<Vm). The condition V1≦V3 is given for the following reason. The selection gate transistor SG1 is given 0V on the gate while the selection gate transistor SG2 is given Vsgd (such as a voltage of around Vdd) on the gate. Accordingly, the tendency to cause GIDL is considered smaller in SG1.

If the selected word line is WL6, the voltages on the upper and lower non-selected word lines next to the selected word line are controlled as same as possible when other word lines are selected. Therefore, the word line WL7 next to the selection gate line SGD is given the write middle voltage Vm.

As for a dummy word line WLDS interposed next to the selection gate line SGS on the source line side, the voltage V1, V2 or Va is applied in accordance with the similar rule to that in the embodiment of FIG. 20.

This makes it possible to prevent failed write in a non-selected cell next to the selection gate line SGD on the bit line side in addition to the effect of the embodiment 2.

Embodiment 4

In addition to the embodiment 2, it is further effective if a dummy cell is arranged next to the selection gate line SGD on the bit line side, and a dummy word line WLDD is arranged to drive the dummy cell.

FIG. 22 shows a write-voltage application method in comparison with the embodiment 3 of FIG. 21 in such the configuration. Namely, a dummy word line WLDS is interposed next to the selection gate line SGS on the source line side and a dummy word line WLDD is interposed next to the selection gate line SGD on the bit line side.

If a word line within a range of WL0-WL6 is selected, the dummy word line WLDD on the bit line side is supplied with the voltage V3 lower than the write middle voltage Vm. As for the dummy word line WLDS on the source line side, the voltage V1, V2 or Va is applied in accordance with the similar rule to that in the embodiment 3 of FIG. 21.

This means that the voltages on the two dummy word lines are controlled to minimize failed write at the time of write in a memory cell subjected to data rewrite and equalize the write characteristics of the memory cells regardless of the position of the selected word line. Namely, a dummy cell and a dummy word line to drive the same are interposed both on the bit line side and the source line side and the voltage application method as shown in FIG. 22 is applied. In this case, the voltages on the upper and lower non-selected word lines next to the selected word line supplied with the write voltage Vpgm can be controlled to almost the same voltage state even if any word line is selected.

In practice, word lines and memory cells can not be processed always in uniform shapes and accordingly the above-described adjustment of the write voltage on each selected word line is not always unnecessary. Regardless of the position of the selected word line, however, the relationship with the voltage applied to the periphery thereof becomes almost constant, and thus the write characteristic can be evened easily.

FIG. 23 shows a voltage application method of a modification of FIG. 22 in the case where the write voltage can be adjusted for each selected word line. In this case, the dummy word line WLDS on the source line side is supplied with V2 or V1 in accordance with the position of the selected cell, and the dummy word line WLDD on the bit line side is supplied with V3 (V1≦V3<Vm).

In this case, the potentials on the upper and lower word lines when the word line WL7 is selected differ from those when other word lines are selected. This can be corrected, however, through the adjustment of the write voltage applied to the selected word line as described above. This is also similar to the case when the word line WL0 is selected.

As described above, V1 and V2 are switched in accordance with the position of the selected word line and applied to the dummy word line WLDS on the source line side to suppress failed write caused in a non-selected cell on the source line side. In addition, V3 is applied to the dummy word line WLDD on the bit line side to suppress failed write caused in a non-selected cell on the bit line side.

FIG. 24 shows an example in which the voltage applied to the dummy word line WLDD on the bit line side in FIG. 23 is switched and set in accordance with the position of the selected word line. For example, the voltage applied to the dummy word line WLDD is switched to V3 when WL0-WL5 is selected, and to a higher voltage V4 (V3<V4≦Vm) when WL6-WL7 is selected. As a result, when the number of non-selected word lines on the bit line side reduces, channels beneath such the regions can be boosted sufficiently.

Even in the example of FIG. 21 where there is no dummy word line on the bit line side, the voltage on the non-selected word line next to the bit line may be switched in accordance with the position of the selected word line.

In the above embodiments, the voltage applied to the word line or the dummy word line WLDS next to the selection gate on the source line side at the time of "1"-write is switched in two stages, between V2 and V1. Alternatively, the voltage may be switched in more than two stages in accordance with the number of cells in the NAND cell unit. The voltages V3, V4 on the dummy word line WLDD on the bit line side in FIG. 24 may be switched in three of more stages similarly.

Further, for simplification of the description in the embodiments, the number of cells contained in the NAND cell unit and the write-voltage application method are limited and the setting ranges of the voltages V1, V2, V3, V4 to be applied to the word lines WL0, WL7 and the dummy word lines WLD(S), WLDD are exemplified. This is an example, though, and various modifications can be devised.

What is claimed is:

1. A non-volatile semiconductor memory device, comprising:

- a NAND cell unit including a plurality of electrically rewritable non-volatile memory cells serially connected, the NAND cell unit having one end connected to a bit line via a first selection gate transistor and an other end connected to a source line via a second selection gate transistor;
- a first dummy cell interposed next to the first selection gate transistor in the NAND cell unit; and
- a second dummy cell interposed next to the second selection gate transistor in the NAND cell unit, wherein the device has a data write mode to boost a first boost channel region that contains a non-write selected memory cell and non-selected memory cells located closer to the first selection gate transistor than the selected memory cell, and a second boost channel region that contains non-selected memory cells located closer to the second selection gate transistor than the selected memory cell, both the first and second boost channel being electrically separated from each other in the NAND cell unit, wherein in the data write mode, a first non-selection voltage applied to the first dummy cell is kept constant irrespective of a position of the selected memory cell in the NAND cell unit.

2. The non-volatile semiconductor memory device according to claim 1, wherein in the data write mode, a non-selection voltage applied to the second dummy cell is switched at least between a first voltage V1 and a second voltage V2 (>V1) in accordance with the position of the selected memory cell in the NAND cell unit.

3. The non-volatile semiconductor memory device according to claim 2, wherein the first non-selection voltage is higher than the first voltage V1.

4. The non-volatile semiconductor memory device according to claim 1, wherein in the data write mode a write voltage Vpgm is applied to the selected memory cell, a write non-selection voltage Vm (<Vpgm) to a first non-selected memory cell contained in the first boost channel region, a channel separation voltage Vb (<Vm) to a second non-selected memory cell or a non-selected memory cell located closer to the second selection gate transistor than the selected memory cell, and a voltage Va (Vb<Va<Vm) to a third non-selected memory cell located between the second non-selected memory cell and the selected memory cell, wherein in the data write mode a write non-selection voltage applied to the second dummy cell is switched to a first voltage V1 (Vb<V1<Vm) when the selected memory cell locates in a first cell region set closer to the first selection gate transistor in the NAND cell unit, and to a second voltage V2 (Vb<V1<V2≦Vm) when the selected memory cell locates in a second cell region set closer to the second selection gate transistor than the first cell region.

5. The non-volatile semiconductor memory device according to claim 4, wherein non-selected memory cells located closer to the second selection gate transistor than the selected memory cell include non-selected memory cells, except the second non-selected memory cell and the third non-selected memory cell, the non-selected memory cells being supplied with the write non-selection voltage Vm.

6. The non-volatile semiconductor memory device according to claim 1, wherein the first non-selection voltage is lower than a voltage applied to the non-selected memory cells.

* * * * *